(12) United States Patent
Huss et al.

(10) Patent No.: US 11,133,793 B1
(45) Date of Patent: Sep. 28, 2021

(54) PHASE INTERPOLATOR WITH PHASE ADJUSTER FOR STEP RESOLUTION

(71) Applicant: Cadence Design Systems, Inc., San Jose, CA (US)

(72) Inventors: Scott David Huss, Cary, NC (US); Loren B. Reiss, Raleigh, NC (US); Christopher George Moscone, Cary, NC (US); Kelvin E. McCollough, Garner, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/108,941

(22) Filed: Dec. 1, 2020

(51) Int. Cl.
| | | |
|---|---|---|
| *H03K 5/135* | (2006.01) | |
| *H03M 9/00* | (2006.01) | |
| *H03K 5/131* | (2014.01) | |
| *H03K 5/00* | (2006.01) | |

(52) U.S. Cl.
CPC .............. *H03K 5/135* (2013.01); *H03K 5/131* (2013.01); *H03M 9/00* (2013.01); *H03K 2005/00052* (2013.01); *H03K 2005/00058* (2013.01); *H03K 2005/00286* (2013.01)

(58) Field of Classification Search
None
See application file for complete search history.

(56) References Cited

U.S. PATENT DOCUMENTS 9,787,313 B1 * 10/2017 Klein ...................... H03M 9/00
2010/0283525 A1 * 11/2010 Yoshikawa ............ H03K 5/135
327/237

* cited by examiner

*Primary Examiner* — Cassandra F Cox
(74) *Attorney, Agent, or Firm* — Schwegman Lundberg & Woessner, P.A.

(57) ABSTRACT

Various embodiments provide for phase interpolators with phase adjusters to provide step resolution, which can be used with a circuit such as a data serializer/deserializer circuit. In particular, for some embodiments, a phase interpolator is coupled to a phase adjuster, where the combination of the phase interpolator and the phase adjuster is configured to interpolate between phases in phase adjustment steps at a phase adjustment step resolution. For such embodiments, the phase adjustment step resolution of the steps is achieved by controlling the phase interpolator and the phase adjuster.

18 Claims, 6 Drawing Sheets

PHASE INTERPOLATOR WITH PHASE ADJUSTER FOR STEP RESOLUTION

TECHNICAL FIELD

Embodiments described herein relate to phase interpolators and, more particularly, to phase interpolators with phase adjusters to provide phase adjustment step resolution, which can be used with a circuit such as a data serializer/deserializer circuit.

BACKGROUND

Digital communication circuits, such as ones that use a data serializer (hereafter, serializer) or a data deserializer (hereafter, deserializer), often use a data sampler to facilitate transmission of data between a digital communications transmitter and receiver. For instance, a transmitter can use a data sampler to perform a delay or duty cycle calibration on the transmitter prior to the transmitter sending data to a receiver. Operation of the data sampler is usually driven by a phase interpolator, which can provide the data sampler with a clock signal that is interpolated in steps (at a phase adjustment step size) across multiple phases.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
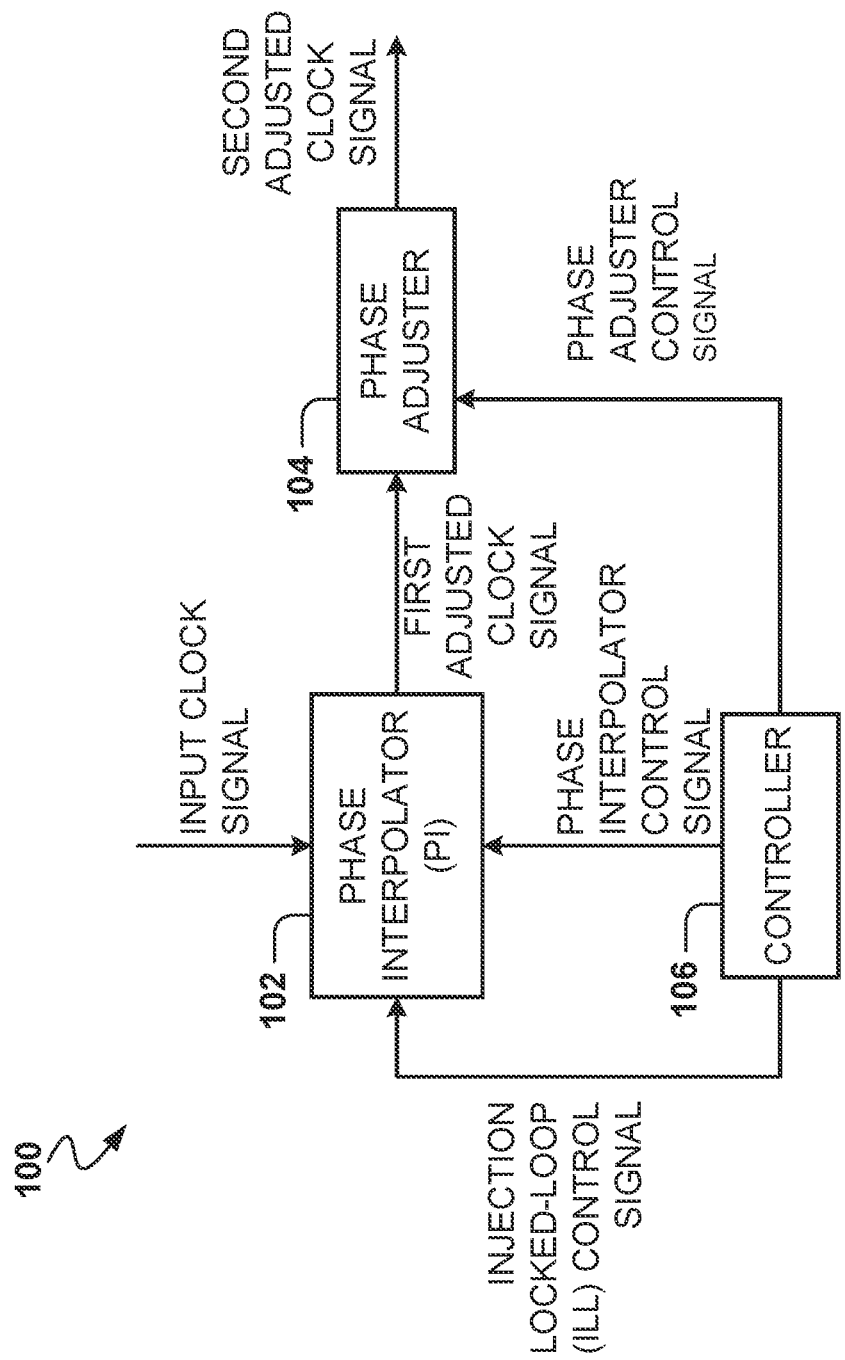
FIG. 1 is a schematic illustrating an example circuit comprising a phase interpolator with a phase adjuster, in accordance with various embodiments.

Traditionally, interpolating a signal (e.g., clock signal) between multiple phases is facilitated by a phase interpolator (PI) that has a certain phase adjustment step capability, which is usually controlled via a control signal (e.g., rotation control) to the PI. For instance, to achieve a phase adjustment step resolution (or step resolution) of thirty-two steps per a unit interval (UI) of signal (e.g., a phase of signal) and of sixty-four steps per a full UI, an application may use a phase interpolator that has a phase adjustment step size of $\frac{1}{32}$ (e.g., $\frac{1}{32}$ UI) to achieve the desired step resolution. Unfortunately, traditional phase interpolators only come in certain step sizes, which can limit the use of phase interpolators in certain applications that need smaller step sizes. Additionally, the smaller the phase adjustment step size (or step size) of the traditional phase interpolator, the more errors found in the signal produced by the traditional phase interpolator.

Various embodiments provide for using phase interpolators with phase adjusters to provide step resolution (e.g., a target step resolution), which can be used with a circuit such as a data serializer/deserializer (SerDes) circuit. In particular, for some embodiments, a phase interpolator is coupled to a phase adjuster, where the combination of the phase interpolator and the phase adjuster is configured to interpolate between phases in phase adjustment steps at a phase adjustment step resolution. For such embodiments, the phase adjustment step resolution of the steps is achieved by controlling the phase interpolator and the phase adjuster. According to various embodiments, to interpolate a given input clock signal, a phase interpolator is used to apply a coarse phase adjustment to the given input clock signal, and a phase adjuster is used to apply a fine phase adjustment (e.g., using a smaller step size) to the adjusted clock signal generated by the phase interpolator. In doing so, various embodiments can achieve better (e.g., smaller) step resolution than using a traditional phase interpolator alone. For instance, for some embodiments, the phase interpolator has a step size of $\frac{1}{16}$ (e.g., $\frac{1}{16}$ UI) and the phase adjuster has a step size of $\frac{1}{64}$, thereby permitting the combination of the phase interpolator and the phase adjuster to achieve a step size of $\frac{1}{64}$. The combination of the coarse phase adjustment and the fine phase adjustment can facilitate a step (e.g., of step size $\frac{1}{64}$) in a positive direction or a negative direction with respect to the given input clock signal.

Depending on the embodiment, each of the phase interpolator and the phase adjuster has their own input to control the step that is being applied by the respective component. For example, the input for controlling the phase interpolator can comprise a rotation control input or a PI control input, while the input for controlling the phase adjuster can comprise a phase control input. The combination of the values inputted into each of the inputs can be regarded as a code that controls the combination of the phase interpolator and the phase adjuster to cause an input clock signal to step in either a positive direction or a negative direction. Each combination of values inputted to the phase interpolator and the phase adjuster can correspond to a different number of steps being applied to the input clock signal by the phase interpolator and the phase adjuster. For some embodiments, the phase interpolator and the phase adjuster are controlled such that they step the input clock signal (in either the positive or negative direction) one step at a time.

For some embodiments, the phase interpolator comprises an injection locked-loop (ILL) input, which can receive an ILL control signal that causes the phase interpolator to adjust (e.g., increase or decrease) an oscillation of the phase interpolator. For example, by way of the ILL input, the phase interpolator can receive a code The ILL input can receive a code (e.g., 0, −1, −2, −3, etc.) that causes an increase or decrease the natural oscillation of the phase interpolator. For some embodiments, the phase interpolator comprises an oscillator (e.g., ring oscillator) with (e.g., configured with) an injection-locked-loop. Additionally, for various embodiments, adjustment of the oscillation (e.g., natural oscillation) of the phase interpolator results in a change in frequency of a signal outputted by the phase interpolator. The adjustment of the frequency of the output signal, via the ILL input, can be independent of the adjustment of the phase of the output signal. Depending on the embodiment, the ILL input can be used to adjust the natural oscillation of the phase interpolator during a calibration process/function performed on the phase interpolator.

Figure 4:
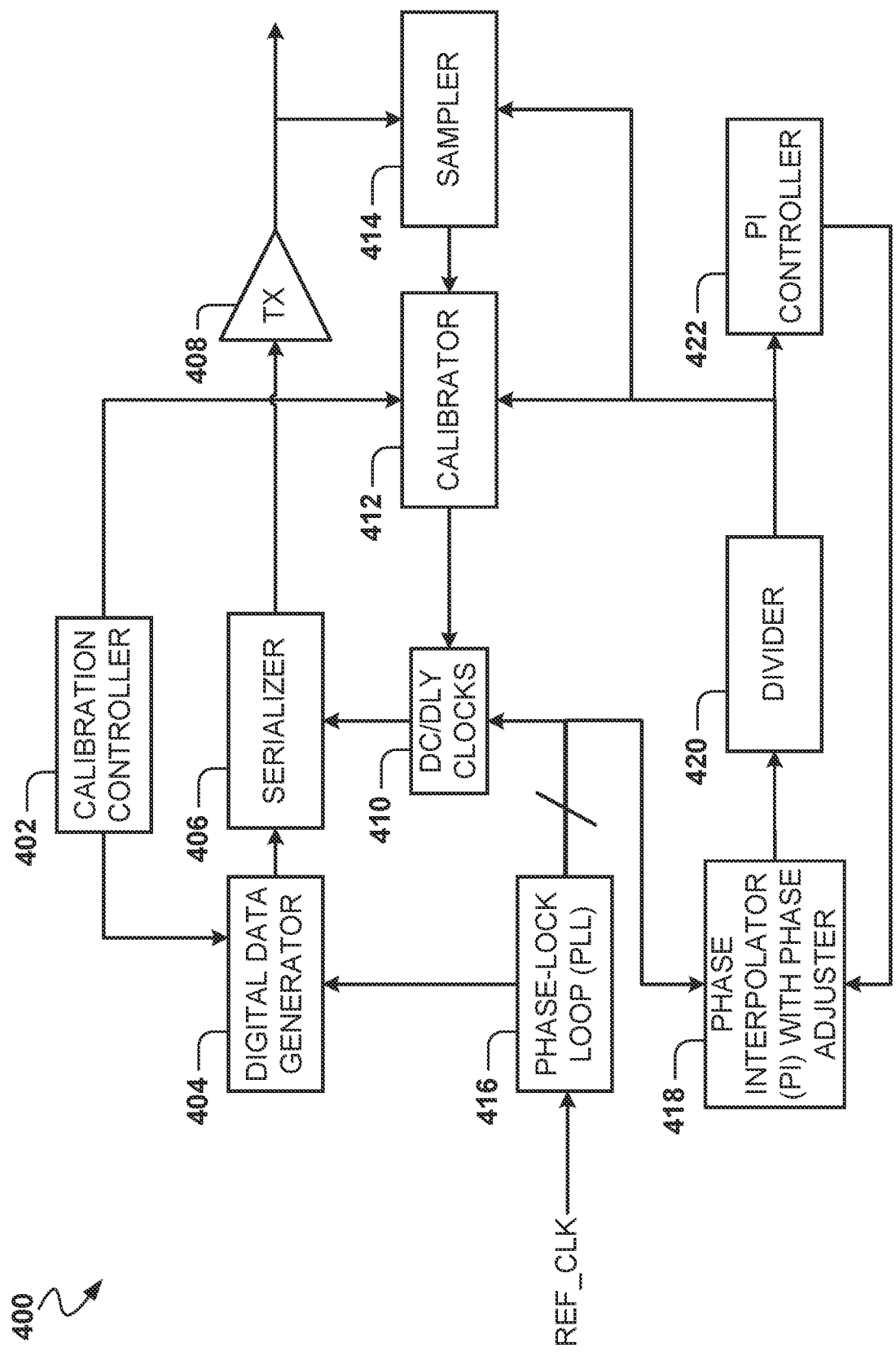
FIG. 4 is a schematic illustrating an example circuit that uses a phase interpolator with a phase adjuster, in accordance with various embodiments, for clock calibration for a serializer.

Various embodiments use a phase interpolator described herein for clock calibration for a serializer (e.g., as illustrated and described with respect to FIG. 4). For some such embodiments, a code sent to the phase interpolator via an ILL input of the phase interpolator is modified (e.g., adjusted) in a certain pattern, which results in the frequency of the signal outputted by the phase interpolator being adjusted according the certain pattern. For instance, the code sent to the phase interpolator via the ILL input can be adjusted according to a triangle form (or triangle pattern) by applying a periodic 0, −1, −2, −3, −3, −2, −1, 0, −1 . . . to the code. As another example, the code sent to the phase interpolator via the ILL input can be adjusted by applying a constant −1, −2, or −3 to the code. Patterns and/or codes used can depend on the embodiment. Adjusting the frequency of the signal outputted by the phase interpolator via the ILL input (described herein) according to a certain pattern can improve clock calibration for the serializer (e.g., by mitigating or avoiding the risk of getting stuck on an integer multiple of clock frequency during clock calibration).

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a schematic illustrating an example circuit 100 comprising a phase interpolator 102 with a phase adjuster 104, in accordance with various embodiments. Depending on the embodiment, the circuit 100 can form part of a larger circuit, such as a circuit for data communications (e.g., SerDes communication). As shown, the circuit 100 comprises a phase interpolator (PI) 102, a phase adjuster 104, and a controller 106. The phase adjuster 104 is coupled to an output of the phase interpolator 102, the phase interpolator 102 is coupled to an output of the controller 106 that provides the phase interpolator 102 with a phase interpolator control signal, the phase interpolator 102 is coupled to an output of the controller 106 that provides the phase interpolator 102 with an injection locked-loop (ILL) control signal, and the phase adjuster 104 is coupled to another output of the controller 106 that provides a phase adjuster control signal. As also shown, the phase interpolator 102 receives an input close signal, the phase interpolator 102 outputs a first adjusted clock signal, the phase adjuster 104 receives the first adjusted clock signal from the phase interpolator 102, and the phase adjuster 104 outputs a second adjusted clock signal. Though not shown, the controller 106 can receive, via an input, digital data that can instruct the operation of the controller 106 and can determine the phase interpolator control signal, the ILL control signal, and the phase adjuster control signal generated by the controller 106.

According to some embodiments, the phase interpolator 102 is configured to receive the input clock signal, to receive the phase interpolator control signal from the controller 106, to generate the first adjusted clock signal based on the input clock signal and the phase interpolator control signal, and to output the first adjusted clock signal. Depending on the embodiment, the phase interpolator control signal controls the amount of step (e.g., phase rotation) applied by the phase interpolator 102 to the input clock signal to generate the first adjusted clock signal.

For various embodiments, the phase interpolator 102 is further configured to receive the ILL control signal from the controller 106, to generate the first adjusted clock signal with a frequency based on the input clock signal and the ILL control signal, and to output the first adjusted clock signal. The phase interpolator 102 can comprise an oscillator with an injection locked-loop (ILL), where the oscillator can be a ring or loop oscillator. The ILL of the phase interpolator 102 can control how the injection locked-loop of the oscillator adjusts an oscillation (e.g., natural oscillation) of the phase interpolator and, in doing so, can control a frequency adjustment applied by the ILL to the first adjusted clock signal. The phase interpolator 102 can apply a frequency adjustment, based on the ILL control signal, in combination with a phase adjustment, based on the phase interpolator control signal. As noted herein, the controller 106 can cause the phase interpolator 102 to apply periodic frequency adjustments (via the ILL control signal) in a certain pattern, such as a triangle form or pattern, which can improve operation or a result of a larger circuit (e.g., clock calibration of a serializer as illustrated and described by FIG. 4).

For some embodiments, the phase adjuster 104 is configured to receive the first adjusted clock signal from the phase interpolator 102, to receive the phase adjuster control signal from the controller 106, to generate the second adjusted clock signal based on the first adjusted clock signal and the phase adjuster control signal, and to output the second adjusted clock signal. Depending on the embodiment, the phase adjuster control signal controls the amount of step (e.g., phase adjustment) applied by the phase adjuster 104 to the first adjusted clock signal to generate the second adjusted clock signal.

For various embodiments, the second adjusted clock signal represents the input clock signal after being stepped in one of a positive direction (e.g., up direction) or a negative direction (e.g., down direction), via the phase interpolator 102 and the phase adjuster 104, based on the first and second control signals. Each step applied to the input clock signal, via the phase interpolator 102 and the phase adjuster 104, can have an expected step size determined by the step size of each of the phase interpolator 102 and the phase adjuster 104. For some embodiments, the phase interpolator 102 has a step size of one over sixteen (1/16) of a unit interval. Additionally, for some embodiments, the phase adjuster 104 has a step size that is a quarter of the step size of the phase interpolator 102 (e.g., one over sixty-four (1/64) of a unit interval). It will be understood that for some embodiments, either the phase interpolator 102, the phase adjuster 104, or both have step sizes that differ from those described herein.

For some embodiments, the phase interpolator 102 applies a coarse phase adjustment (based on the phase interpolator control signal) to the input clock signal, while the phase adjuster 104 applies a fine phase adjustment (based on the phase adjuster control signal), where the coarse phase adjustment causes a larger phase adjustment (e.g., coarser step) to the input clock signal than the fine phase adjustment causes to the first adjusted clock signal. As described herein, the coarse phase adjustment (applied to the input clock signal) by the phase interpolator 102, and the fine phase adjustment (applied to the first adjusted clock signal) by the phase adjuster 104, can enable various embodiments to step the input clock signal with better (e.g., finer) step resolution than using a traditional phase interpolator alone.

Accordingly, for some embodiments, the controller 106 generates the phase interpolator control signal such that the phase interpolator 102 implements the coarse phase adjustment to the input clock signal, based on the phase interpolator control signal, to generate the first adjusted clock signal, and the controller 106 generates the phase adjuster control signal such that phase adjuster 104 implements the fine phase adjustment to the first adjusted clock signal, based on the phase adjuster control signal, to generate the second adjusted clock signal. The phase interpolator control signal can represent a first value and the phase adjuster control signal can represent a second value, and where each different combination of the first value and the second value causes the phase interpolator 102 and the phase adjuster 104 to apply a different number of steps, to the input clock signal, to generate the second adjusted clock signal. For some embodiments, the controller 106 generates the phase interpolator control signal and the phase adjuster control signal by: the controller 106 receiving digital data that instructs the controller 106 to step the input clock signal in one of the positive direction or the negative direction by a single step; and the controller 106 generating the phase interpolator control signal and the phase adjuster control signal based on the digital data.

For some embodiments, the controller 106 is configured to change from a current number (e.g., +2 steps) of steps being applied to the input clock signal to a target number of steps (e.g., +5 steps) being applied to the input clock signal. The change can comprise cycling (e.g., traversing) through an ordered number of steps one step at a time (e.g., from +2 steps to +3 steps, from +3 steps to +4 steps, and from +4 steps to +5 steps) until the target number of steps (e.g., +5 steps) is reached, and the controller 106 generating the first control signal and the second control signal based on the cycling.

Figure 2:
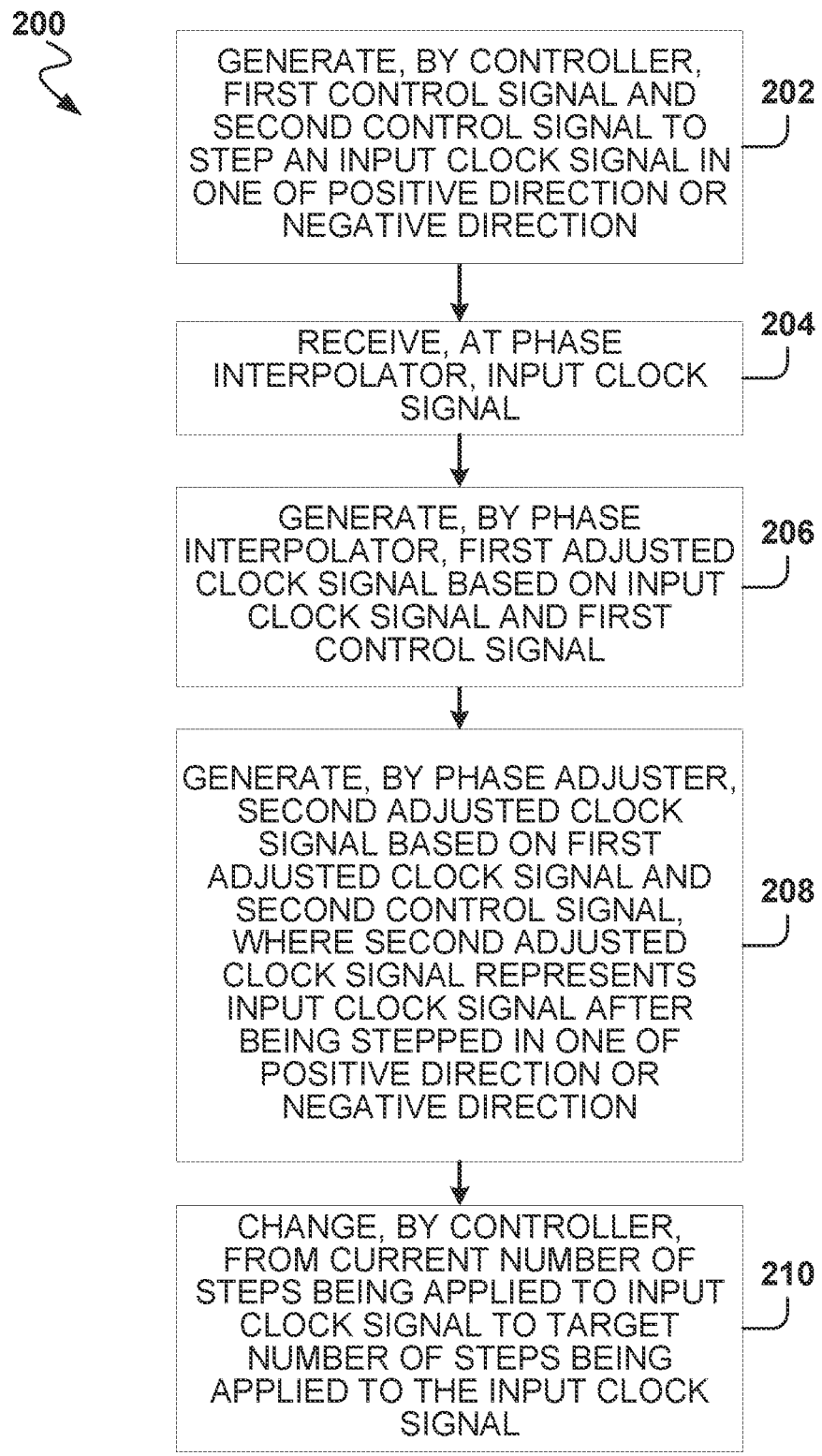
FIG. 2 is a flowchart illustrating an example method for generating an adjusted clock signal using a phase interpolator with a phase adjuster, in accordance with some embodiments.

FIG. 2 is a flowchart illustrating an example method 200 for generating an adjusted clock signal using a phase interpolator with a phase adjuster, in accordance with some embodiments. Some or all of the method 200 can be performed by a circuit such as the circuit 100 described herein with respect to FIG. 1. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 2, the method 200 begins with operation 202, where a controller (e.g., 106) generates a first control signal and a second control signal to step an input clock signal in one of a positive direction or a negative direction. For some embodiments, the controller generates the first control signal and the second control signal by: the controller receiving digital data that instructs the controller to step the input clock signal in one of the positive direction or the negative direction by a single step; and the controller generating the first and second control signals based on the digital data. For instance, the digital data can comprise an instruction to increment or decrement the number of steps being applied to the input clock signal via a phase interpolator and a phase adjuster of an embodiment. According to some embodiments, the first control signal represents a first value, the second control signal represents a second value, and each different combination of the first value and the second value causes the phase interpolator and the phase adjuster to apply a different number of steps, to the input clock signal, to generate the second adjusted clock signal.

At operation 204, a phase interpolator (e.g., 102) receives the input clock signal (e.g., reference clock signal or a sample clock signal).

At operation 206, the phase interpolator (e.g., 102) generates a first adjusted clock signal based on the input clock signal (received by operation 204) and the first control signal (generated by operation 202). For some embodiments, the first control signal causes the phase interpolator (e.g., 102) to apply a first phase adjustment to the input clock signal to generate the first adjusted clock signal. According to some embodiments, the first phase adjustment comprises a coarse phase adjustment being applied to the input clock signal. Additionally, for some embodiments, the phase interpolator is further configured to receive a third control signal (e.g., ILL control signal), where the third control signal causes the phase interpolator (e.g., 102) to apply a frequency adjustment to the first adjusted clock signal outputted by the phase interpolator. For instance, the phase interpolator can comprise an oscillator with an injection locked-loop, and the third control signal can control how the injection locked-loop of the oscillator adjusts an oscillation of the phase interpolator, which adjusts the frequency of the first adjusted clock signal outputted by the phase interpolator.

At operation 208, a phase adjuster (e.g., 104) generates a second adjusted clock signal based on the first adjusted clock signal (generated by operation 206) and the second control signal (generated by operation 202), where the second adjusted clock signal represents the input clock signal after being stepped in one of the positive direction or the negative direction based on the first and second control signals. For some embodiments, the second control signal causes the phase adjuster (e.g., 104) to apply a second phase adjustment to the first adjusted clock signal to generate the second adjusted clock signal. According to some embodiments, the second phase adjustment comprises a fine phase adjustment being applied to the first adjusted clock signal, where the coarse phase adjustment causes a larger phase adjustment to the input clock signal than the fine phase adjustment causes to the first adjusted clock signal. The combination of the coarse phase adjustment and the fine phase adjustment by the phase interpolator and the phase adjuster enables various embodiments to step the input clock signal in a positive direction (e.g., up direction) or a negative direction (e.g., down direction) according to a desired step resolution (e.g., ¹⁄₆₄ over a full UI), and can enable various embodiments to do so without the drawbacks of using a traditional phase interpolator to achieve the desired step resolution.

At operation 210, the controller (e.g., 106) changes from a current number of steps being applied to the input clock signal to a target number of steps being applied to the input clock signal. For some embodiments, operation 210 comprises cycling through an ordered number of steps one step at a time until the target number of steps is reached. The controller can generate the first control signal and the second control signal based on the cycling. For instance, to reach +3 step, the controller can cycle from a +1 step, to +2 step, and to +3 step, and the controller can generate the first and second control signals accordingly.

Figure 3:
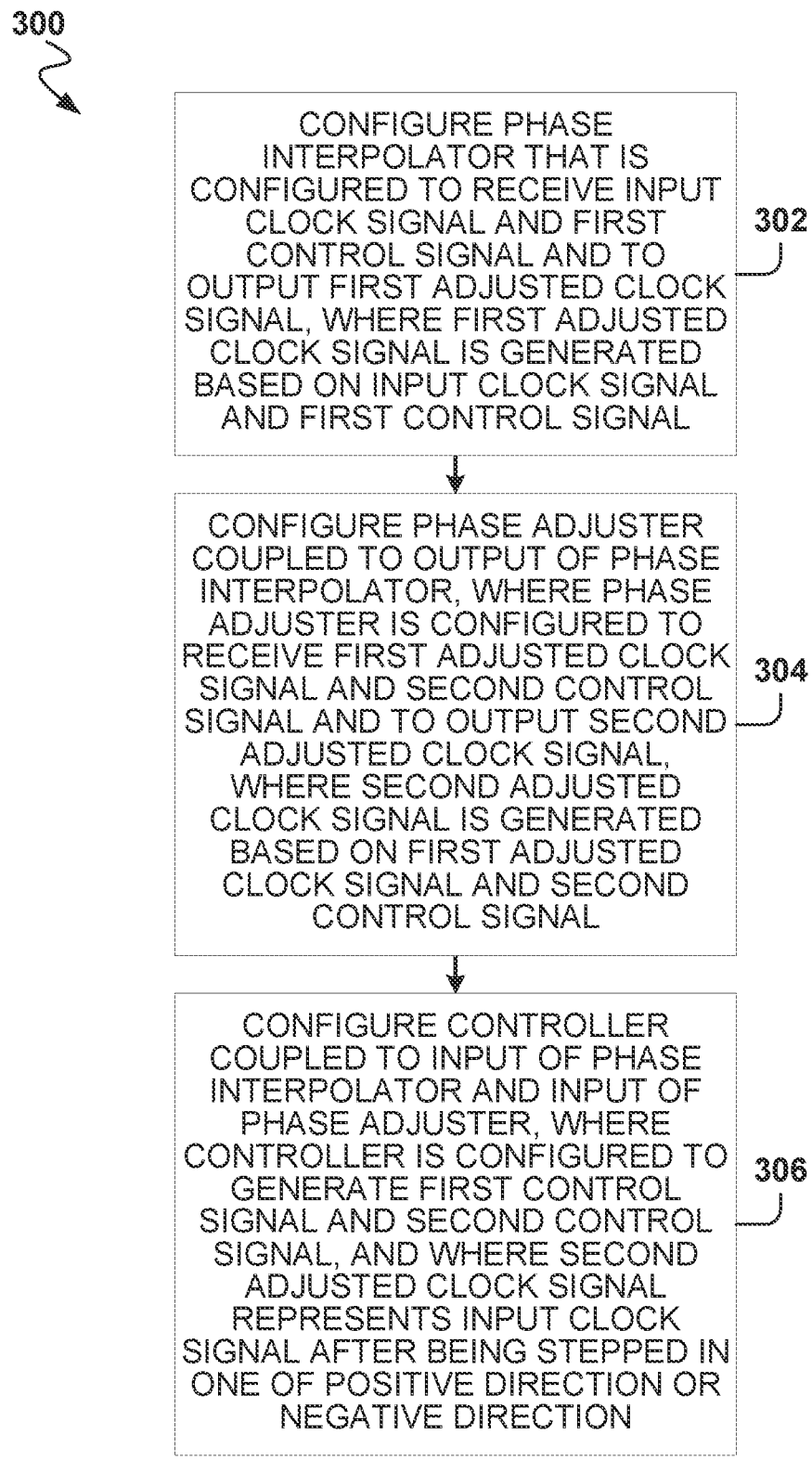
FIG. 3 is a flowchart illustrating an example method for generating a circuit design including a phase interpolator with a phase adjuster, in accordance with some embodiments.

FIG. 3 is a flowchart illustrating an example method 300 for generating a circuit design including a phase interpolator with a phase adjuster, in accordance with some embodiments. It will be understood that the method 300 can be performed by a device, such as a computing device executing instructions of an EDA software system, in accordance with some embodiments. Additionally, the method 300 herein can be implemented in the form of executable instructions stored on a computer-readable medium or in the form of electronic circuitry. For instance, the operations of the method 300 may be represented by executable instructions that, when executed by a processor of a computing device, cause the computing device to perform the method 300. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 3, the method 300 begins with operation 302, where a phase interpolator (e.g., 102) is configured within a circuit design, where the phase interpolator is configured to receive an input clock signal and a first control signal and to output a first adjusted clock signal, and where the first adjusted clock signal is generated by the phase interpolator based on the input clock signal and the first control signal. The phase interpolator can be further configured to receive a third control signal (e.g., ILL control signal), where the phase interpolator adjust a frequency of the first adjusted clock signal based on the third control signal. The phase interpolator can comprise an oscillator with an injection locked-loop, and the third control signal can control the injection locked-loop of the oscillator. At operation 304, a phase adjuster (e.g., 104) is configured within the circuit design, where the phase adjuster is coupled to an output of the phase interpolator, where the phase adjuster is configured to receive the first adjusted clock signal and a second control signal and to output a second adjusted clock signal, and where the second adjusted clock signal is generated by the phase adjuster based on the first adjusted clock signal and the second control signal. At operation 306, a controller (e.g., 106) is configured within the circuit design, where the controller is coupled to an input of the phase interpolator and an input of the phase adjuster, where the controller is configured to generate the first control signal and the second control signal to step the input clock signal in one of a positive direction or a negative direction. As described herein, the second adjusted clock signal can represent the input clock signal after being stepped in one of the positive direction or the negative direction based on the first and second control signals.

FIG. 4 is a schematic illustrating an example circuit 400 that uses a phase interpolator with a phase adjuster (hereafter, the PI 418), in accordance with various embodiments, for clock calibration for a serializer 406. In particular, the circuit 400 illustrates an example of how an asynchronous or pseudo-asynchronous clock signal can be generated to facilitate clock calibration for the serializer 406. As shown, the circuit 400 comprises a calibration controller 402, a digital data generator 404, the serializer 406, a driver 408, a data sampler 414 (hereafter, the sampler 414), a clock calibrator 412 (hereafter, the calibrator 412), a phase-lock loop (PLL) 416, the PI 418, a divider 420, and a phase interpolator (PI) controller 422. As also shown, the PI 418 is coupled to an output of the PLL 416, the divider 420 is coupled to an output of the PI 418, each of the calibrator 412, the sampler 414, and the PI controller 422 is coupled to an output of the divider 420, and the PI 418 is also coupled to an output of the PI controller 422. For some embodiments, the PI controller 422 provides digital data to the PI 418 that instructs the PI 418 to step a clock signal the PI 418 receives from the PLL 416 in one of a positive direction or a negative direction by a single step as described herein.

During operation, the PLL 416 can receive a reference clock signal, generate a plurality of clock signals (e.g., four quarter-rate clock signals) based on the reference clock signal, and generate a clock signal (e.g., FUI/32) for the digital data generator 404. In FIG. 4, duty cycle/delay adjusted clock signals 410 (DC/DLY clock signals 410) represent the plurality of clock signals generated by the PLL 416 and after being adjusted in accordance with calibration data generated by the calibrator 412. As shown, the DC/DLY clock signals 410 are eventually provided to the serializer 406, where the DC/DLY clock signals 410 can drive operation of the serializer 406. The calibration controller 402 can control operation of the digital data generator 404 and the calibrator 412 can facilitate adjustments (e.g., calibration) of one or more of the DC/DLY clock signals 410.

In FIG. 4, the plurality of clock signals generated by the PLL 416 are also provided to the PI 418, which can facilitate generation of the asynchronous/pseudo-asynchronous clock signal used by the calibrator 412 and the sampler 414. For some embodiments, the PI 418 has a step size that facilitates sufficient resolution by the sampler 414. For instance, the PI 418 can update at full unit interval (FUI) of 64 (FUI/64) and can have a step size of 1/16 unit interval (UI). This can enable the sampler 414 to sample at a frequency of (FUI/64)*(1+/−1/(64*16*2)) (e.g., assuming PI updates on every other clock cycle). For some embodiments, the PI 418 is stepped every other clock cycle.

The divider 420 can receive an interpolated clock signal generated by the PI 418, and generate a divided clock signal based on the interpolated clock signal. For some embodiments, this divided clock signal represents the asynchronous/pseudo-asynchronous clock signal that is used by each of the calibrator 412 and the sampler 414. For various embodiments, the PI controller 422 facilitates feedback adjustment of the PI 418 based on the divided clock signal generated by the divider 420.

Figure 5:
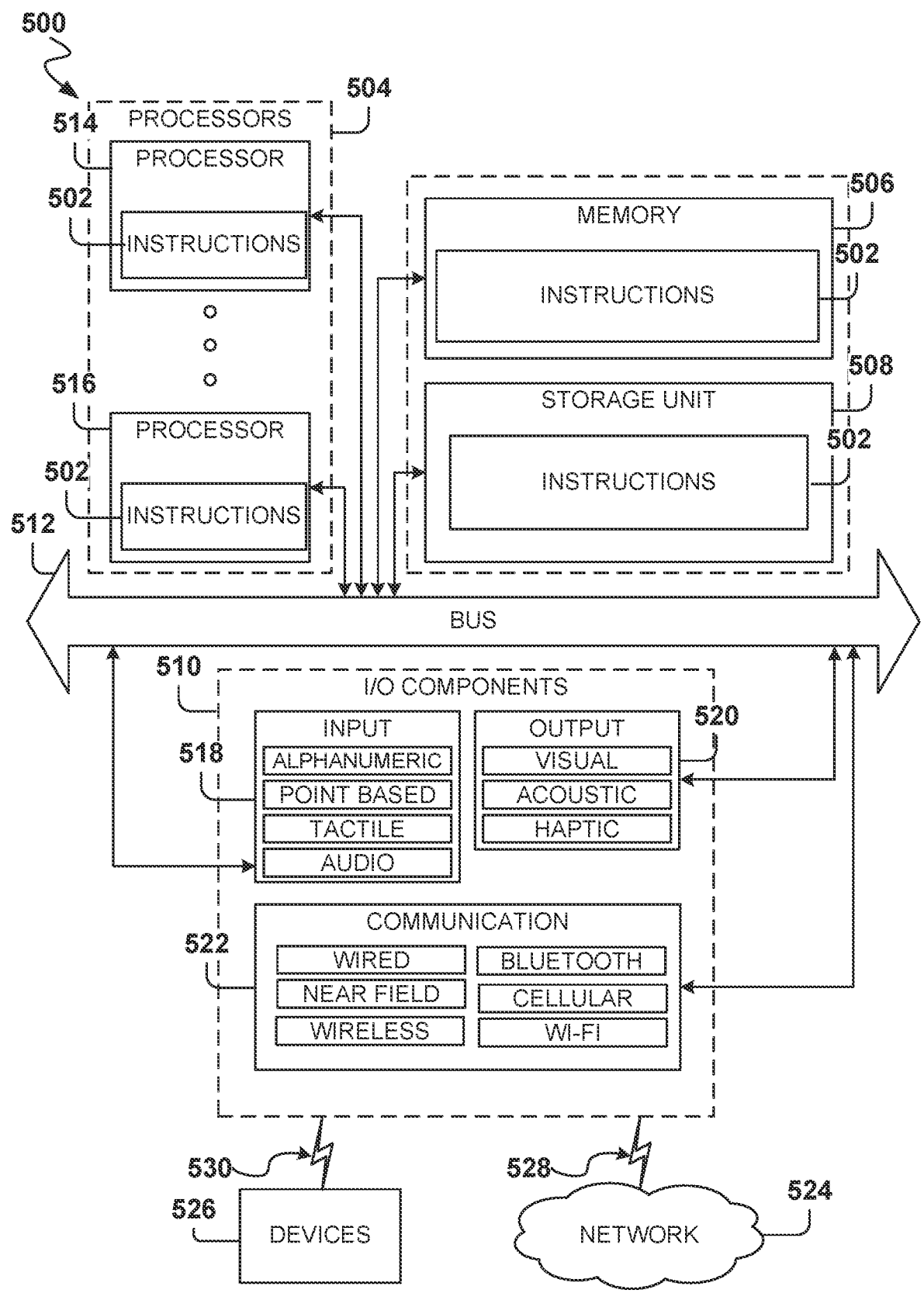
FIG. 5 is a block diagram illustrating components of a machine, according to some example embodiments, able to read instructions from a machine-readable medium and perform any one or more of the methodologies discussed herein.

FIG. 5 is a block diagram illustrating components of a machine 500, according to some example embodiments, able to read instructions from a machine-readable medium (e.g., a machine-readable storage medium) and perform any one or more of the methodologies discussed herein. Specifically, FIG. 5 shows a diagrammatic representation of the machine 500 in the example form of a system within which instructions 502 (e.g., software, a program, an application, an applet, an app, a driver, or other executable code) for causing the machine 500 to perform any one or more of the methodologies discussed herein may be executed. For example, the instructions 502 include executable code that causes the machine 500 to execute the method 300 described with respect to FIG. 3. In this way, these instructions 502 transform the general, non-programmed machine 500 into a particular machine programmed to carry out the described and illustrated method 300 in the manner described herein. The machine 500 may operate as a standalone device or may be coupled (e.g., networked) to other machines.

By way of non-limiting example, the machine 500 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 502, sequentially or otherwise, that specify actions to be taken by the machine 500. Further, while only a single machine 500 is illustrated, the term "machine" shall also be taken to include a collection of machines 500 that individually or jointly execute the instructions 502 to perform any one or more of the methodologies discussed herein.

The machine 500 may include processors 504, memory 506, a storage unit 508, and I/O components 510, which may be configured to communicate with each other such as via a bus 512. In an example embodiment, the processors 504 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 514 and a processor 516 that may execute the instructions 502. The term "processor" is intended to include multi-core processors 504 that may comprise two or more independent processors (sometimes referred to as "cores") that may execute instructions 502 contemporaneously. Although FIG. 5 shows multiple processors 504, the machine 500 may include a single processor with a single core, a single processor with multiple cores (e.g., a multi-core processor), multiple processors with a single core, multiple processors with multiple cores, or any combination thereof.

The memory 506 (e.g., a main memory or other memory storage) and the storage unit 508 are both accessible to the processors 504 such as via the bus 512. The memory 506 and the storage unit 508 store the instructions 502 embodying any one or more of the methodologies or functions described herein. The instructions 502 may also reside, completely or partially, within the memory 506, within the storage unit 508, within at least one of the processors 504 (e.g., within the processor's cache memory), or any suitable combination thereof, during execution thereof by the machine 500. Accordingly, the memory 506, the storage unit 508, and the memory of the processors 504 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 502. The term "machine-readable medium" shall also be taken to include any medium, or combination of multiple media, that is capable of storing instructions (e.g., instructions 502) for execution by a machine (e.g., machine 500), such that the instructions, when executed by one or more processors of the machine (e.g., processors 504), cause the machine to perform any one or more of the methodologies described herein (e.g., method 300). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 510 may include a wide variety of components to receive input, provide output, produce output, transmit information, exchange information, capture measurements, and so on. The specific 110 components 510 that are included in a particular machine 500 will depend on the type of the machine 500. For example, portable machines such as mobile phones will likely include a touch input device or other such input mechanisms, while a headless server machine will likely not include such a touch input device. It will be appreciated that the I/O components 510 may include many other components that are not specifically shown in FIG. 5. The I/O components 510 are grouped according to functionality merely for simplifying the following discussion and the grouping is in no way limiting. In various example embodiments, the I/O components 510 may include input components 518 and output components 520. The input components 518 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 520 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 510 may include communication components 522 operable to couple the machine 500 to a network 524 or devices 526 via a coupling 528 and a coupling 530 respectively. For example, the communication components 522 may include a network interface component or another suitable device to interface with the network 524. In further examples, the communication components 522 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 526 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 6:
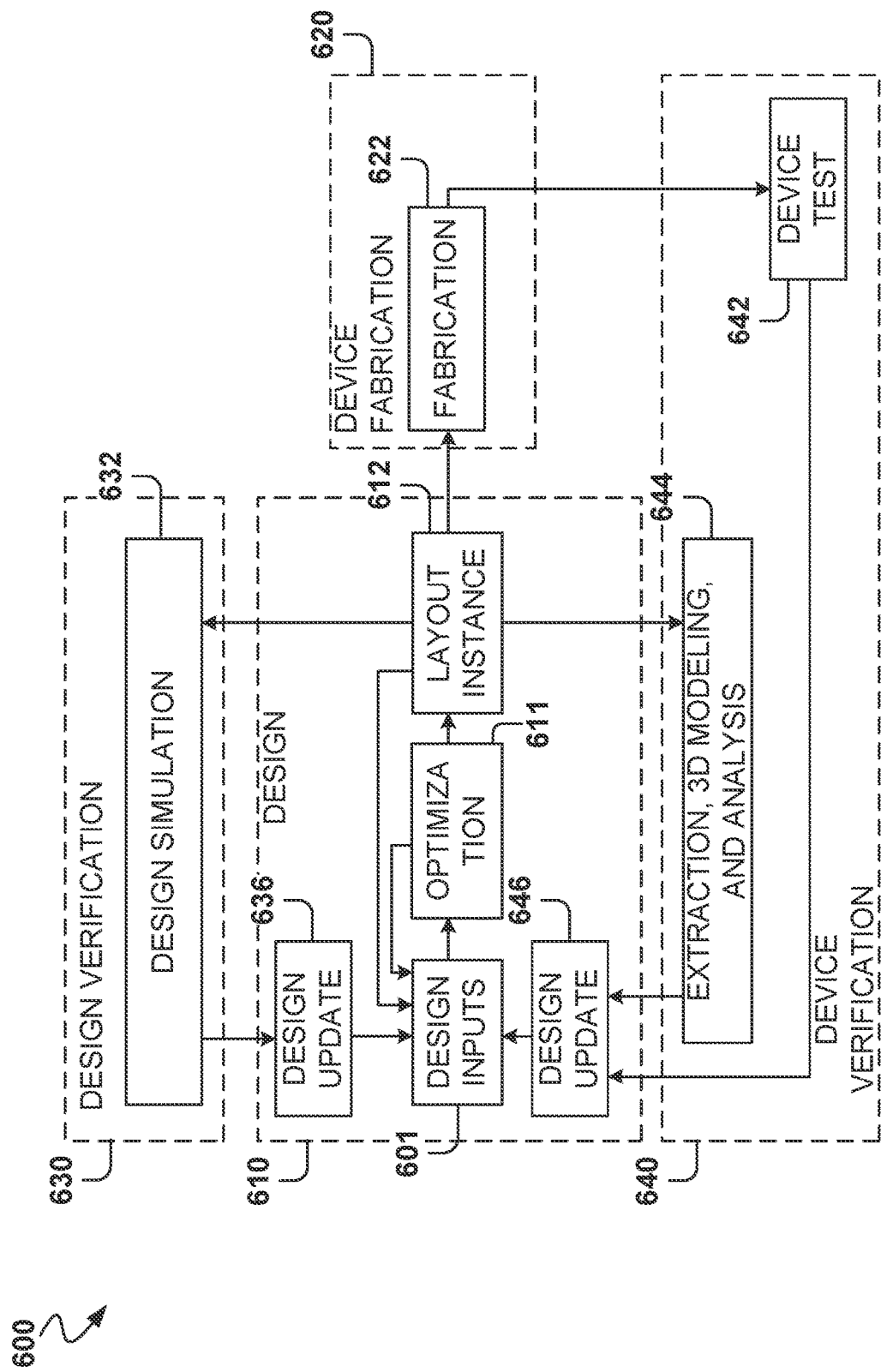
FIG. 6 is a diagram illustrating one possible design process flow for generating a circuit, including embodiments to implement a phase interpolator with a phase adjuster as described herein, and in various embodiments, to integrate the phase interpolator with the phase adjuster with a larger circuit.

FIG. 6 is a diagram illustrating one possible design process flow for generating a circuit, including embodiments to implement a phase interpolator with a phase adjuster as described herein, and in various embodiments, to integrate the phase interpolator with the phase adjuster with a larger circuit (e.g., SerDes circuit). As illustrated, the overall design flow 600 includes a design phase 610, a device fabrication phase 620, a design verification phase 630, and a device verification phase 640. The design phase 610 involves an initial design input operation 601 where the basic elements and functionality of a device are determined, as well as revisions based on various analyses and optimization of a circuit design. This design input operation 601 is where instances of an EDA circuit design file are used in the design and any additional circuitry is selected. The initial strategy, tactics, and context for the device to be created are also generated in the design input operation 601, depending on the particular design algorithm to be used.

In some embodiments, following an initial selection of design values in the design input operation 601, timing analysis and optimization according to various embodiments occurs in an optimization operation 611, along with any other automated design processes. One such process may be the automated design of a partitioned root search for error locator polynomial functions in RS FEC decoding. As described below, design constraints for blocks of a circuit design generated with design inputs in the design input operation 601 may be analyzed using hierarchical timing analysis, according to various embodiments. While the design flow 600 shows such optimization occurring prior to a layout instance 612, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 622.

After design inputs are used in the design input operation 601 to generate a circuit layout, and any optimization operations 611 are performed, a layout is generated in the layout instance 612. The layout describes the physical layout dimensions of the device that match the design inputs. This layout may then be used in the device fabrication operation 622 to generate a device, or additional testing and design updates may be performed using designer inputs or automated updates based on design simulation 632 operations or extraction, 3D modeling, and analysis 644 operations. Once the device is generated, the device can be tested as part of device test 642 operations, and layout modifications generated based on actual device performance.

As described in more detail below, design updates 636 from the design simulation 632, design updates 646 from the device test 642, the 3D modeling and analysis 644 operations, or the design input operation 601 may occur after an initial layout instance 612 is generated. In various embodiments, whenever design inputs are used to update or change an aspect of a circuit design, a timing analysis and optimization operation 611 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
   a phase interpolator configured to receive an input clock signal and a first control signal and to output a first adjusted clock signal, the first adjusted clock signal being generated by the phase interpolator based on the input clock signal and the first control signal;
   a phase adjuster coupled to an output of the phase interpolator, the phase adjuster being configured to receive the first adjusted clock signal and a second control signal and to output a second adjusted clock signal, the second adjusted clock signal being generated by the phase adjuster based on the first adjusted clock signal and the second control signal; and
   a controller coupled to an input of the phase interpolator and an input of the phase adjuster, the controller being configured to generate the first control signal such that the phase interpolator implements a coarse phase adjustment to the input clock signal to generate the first adjusted clock signal, the controller being configured to generate the second control signal such that the phase adjuster implements a fine phase adjustment to the first adjusted clock signal to generate the second adjusted clock signal, the coarse phase adjustment causing a larger phase adjustment to the input clock signal than the fine phase adjustment causes to the first adjusted clock signal, and the second adjusted clock signal representing the input clock signal after being stepped in one of a positive direction or a negative direction based on the first and the second control signals.

2. The circuit of claim 1, wherein the first control signal represents a first value, wherein the second control signal represents a second value, and wherein each different combination of the first value and the second value causes the phase interpolator and the phase adjuster to apply a different number of steps, to the input clock signal, to generate the second adjusted clock signal.

3. The circuit of claim 1, wherein the controller is configured to change from a current number of steps being applied to the input clock signal to a target number of steps being applied to the input clock signal, the changing comprising cycling through an ordered number of steps one step at a time until the target number of steps is reached, and the controller generating the first control signal and the second control signal based on the cycling.

4. The circuit of claim 1, wherein the phase interpolator is configured to receive a third control signal, the phase interpolator adjusting a frequency of the first adjusted clock signal based on the third control signal.

5. The circuit of claim 4, wherein the phase interpolator comprises an oscillator with an injection locked-loop, and the third control signal controls the injection locked-loop.

6. The circuit of claim 1, wherein the controller comprises a control input that receives digital data that instructs the controller to step the input clock signal in one of the positive direction or the negative direction by a single step, the first and the second control signals being generated by the controller based on the digital data.

7. A method comprising:
   generating, by a controller, a first control signal and a second control signal to step an input clock signal in one of a positive direction or a negative direction;
   receiving, at a phase interpolator, the input clock signal;
   generating, by the phase interpolator, a first adjusted clock signal based on the input clock signal and the first control signal, the first control signal causing the phase interpolator to apply a first phase adjustment to the input clock signal to generate the first adjusted clock signal, and the first phase adjustment comprising a coarse phase adjustment; and
   generating, by a phase adjuster, a second adjusted clock signal based on the first adjusted clock signal and the second control signal, the second control signal causing the phase adjuster to apply a second phase adjustment to the first adjusted clock signal to generate the second adjusted clock signal, the second chase adjustment comprising a fine phase adjustment, the coarse chase adjustment of the first phase adjustment causing a larger phase adjustment to the input clock signal than the fine phase adjustment of the second phase adjustment causes to the first adjusted clock signal, and the second adjusted clock signal representing the input clock signal after being stepped in one of the positive direction or the negative direction based on the first and the second control signals.

8. The method of claim 7, wherein the first control signal represents a first value, wherein the second control signal represents a second value, and wherein each different combination of the first value and the second value causes the phase interpolator and the phase adjuster to apply a different number of steps, to the input clock signal, to generate the second adjusted clock signal.

9. The method of claim 7, comprising:
   changing, by the controller, from a current number of steps being applied to the input clock signal to a target number of steps being applied to the input clock signal, the changing comprising cycling through an ordered number of steps one step at a time until the target number of steps is reached, and the controller generating the first control signal and the second control signal based on the cycling.

10. The method of claim 7, wherein the phase interpolator is configured to receive a third control signal, the phase interpolator adjusting a frequency of the first adjusted clock signal based on the third control signal.

11. The method of claim 10, wherein the phase interpolator comprises an oscillator with an injection locked-loop, and the third control signal controls the injection locked-loop.

12. The method of claim 7, wherein the generating the first control signal and the second control signal by the controller comprises:
   receiving, at the controller, digital data that instructs the controller to step the input clock signal in one of the positive direction or the negative direction by a single step; and
   generating, by the controller, the first and the second control signals based on the digital data.

13. A non-transitory computer-readable medium comprising instructions that, when executed by one or more processors of a computing device, cause the computing device to generate a circuit design by performing operations comprising:
   configuring, in the circuit design, a phase interpolator that is configured to receive an input clock signal and a first control signal and to output a first adjusted clock signal, the first adjusted clock signal being generated by the phase interpolator based on the input clock signal and the first control signal;
   configuring, in the circuit design, a phase adjuster coupled to an output of the phase interpolator, the phase adjuster being configured to receive the first adjusted clock signal and a second control signal and to output a second adjusted clock signal, the second adjusted clock signal being generated by the phase adjuster based on the first adjusted clock signal and the second control signal; and configuring, in the circuit design, a controller coupled to an input of the phase interpolator and an input of the phase adjuster, the controller being configured to generate the first control signal such that the phase interpolator implements a coarse phase adjustment to the input clock signal to generate the first adjusted clock signal, such that the phase adjuster implements a fine phase adjustment to the first adjusted clock signal to generate the second adjusted clock signal, and the second adjusted clock signal representing the input clock signal after being stepped in one of a positive direction or a negative direction based on the first and the second control signals.

14. The non-transitory computer-readable medium of claim 13, wherein the first control signal represents a first value, wherein the second control signal represents a second value, and wherein each different combination of the first value and the second value causes the phase interpolator and the phase adjuster to apply a different number of steps, to the input clock signal, to generate the second adjusted clock signal.

15. The non-transitory computer-readable medium of claim 13, wherein the controller is configured to change from a current number of steps being applied to the input clock signal to a target number of steps being applied to the input clock signal, the changing comprising cycling through an ordered number of steps one step at a time until the target number of steps is reached, and the controller generating the first control signal and the second control signal based on the cycling.

16. The non-transitory computer-readable medium of claim 13, wherein the phase interpolator is configured to receive a third control signal, the phase interpolator adjusting a frequency of the first adjusted clock signal based on the third control signal.

17. The non-transitory computer-readable medium of claim 16, wherein the phase interpolator comprises an oscillator with an injection locked-loop, and the third control signal controls the injection locked-loop.

18. The non-transitory computer-readable medium of claim 13, wherein the controller comprises a control input that receives digital data that instructs the controller to step the input clock signal in one of the positive direction or the negative direction by a single step, the first and the second control signals being generated by the controller based on the digital data.

* * * * *